(12) United States Patent
Gelso et al.

(10) Patent No.: US 11,904,724 B2
(45) Date of Patent: Feb. 20, 2024

(54) METHOD FOR ESTIMATING AN OPERATING PARAMETER OF A BATTERY CELL IN A VEHICLE

(71) Applicant: VOLVO TRUCK CORPORATION, Gothenburg (SE)

(72) Inventors: Esteban Gelso, Gothenburg (SE); Jonas Hellgren, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 349 days.

(21) Appl. No.: 17/276,400

(22) PCT Filed: Sep. 17, 2018

(86) PCT No.: PCT/EP2018/075081
§ 371 (c)(1),
(2) Date: Mar. 15, 2021

(87) PCT Pub. No.: WO2020/057721
PCT Pub. Date: Mar. 26, 2020

(65) Prior Publication Data
US 2021/0316636 A1 Oct. 14, 2021

(51) Int. Cl.
*B60L 58/12* (2019.01)
*G01R 31/396* (2019.01)
(Continued)

(52) U.S. Cl.
CPC ............ *B60L 58/12* (2019.02); *G01R 31/367* (2019.01); *G01R 31/396* (2019.01);
(Continued)

(58) Field of Classification Search
CPC ...... B60L 58/12; B60L 2260/44; B60L 50/60; B60L 2200/18; B60L 2200/36;
(Continued)

(56) References Cited

U.S. PATENT DOCUMENTS 6,608,482 B2 * 8/2003 Sakai ............... G01R 19/16542
324/426
9,209,643 B2 * 12/2015 Nishikawa ............. B60L 50/51
(Continued)

FOREIGN PATENT DOCUMENTS

CN 103529398 A 1/2014
DE 102012207817 A1 11/2012
(Continued)

OTHER PUBLICATIONS

Korean Office Acted dated Oct. 25, 2022 in corresponding Korean Patent Application No. 10-2021-7011586, 13 pages.
(Continued)

*Primary Examiner* — David Luo
(74) *Attorney, Agent, or Firm* — Venable LLP; Jeffri A. Kaminski

(57) ABSTRACT

The invention relates to a method (100) for estimating an operating parameter of a battery cell of a battery unit in an electrical propulsion system of a vehicle, the operating parameter being indicative of one of capacity and impedance of the battery cell, the method comprising: selecting (110) at least one battery cell in the battery unit for determining the operating parameter of the battery cell; providing (120) a set of state-of-charge (SOC) estimators, each SOC estimator having a selected operating parameter value for a given time period; and using (130) the set of SOC estimators to determine a value of the operating parameter of the battery cell by performing voltage error minimization.

13 Claims, 4 Drawing Sheets

(51) Int. Cl.
*G01R 31/367* (2019.01)
*H02J 7/00* (2006.01)

(52) U.S. Cl.
CPC .......... *H02J 7/0048* (2020.01); *H02J 7/0063* (2013.01); *B60L 2260/44* (2013.01)

(58) Field of Classification Search
CPC ... G01R 31/367; G01R 31/396; H02J 7/0048; H02J 7/0063; Y02T 10/70; Y02T 10/7072; G05B 23/0254; G05B 17/02; B60Y 2200/142; B60Y 2200/143; B60Y 2200/415; B60Y 2200/417; B60Y 2200/91; B60Y 2200/92
USPC ................................................. 318/139, 558
See application file for complete search history.

(56) References Cited

U.S. PATENT DOCUMENTS

| | | |
|---|---|---|
| 2012/0290234 A1 | 11/2012 | Schaefer |
| 2013/0090871 A1 | 4/2013 | Akabori et al. |
| 2014/0058595 A1 | 2/2014 | Li et al. |
| 2014/0347012 A1 | 11/2014 | Shim et al. |
| 2018/0111599 A1 | 4/2018 | Wang et al. |

FOREIGN PATENT DOCUMENTS

| | | |
|---|---|---|
| DE | 102013220015 A1 | 4/2014 |
| JP | 2015099042 A | 5/2015 |
| WO | 2015102074 A1 | 7/2015 |

OTHER PUBLICATIONS

Sun Fengchun et al: "A novel dual-scale cell state-of-charge estimation approach for series-connected battery pack used in electric vehicles", Journal of Power Sources, Elsevier SA, CH vol. 274, Oct. 24, 2014 (Oct. 24, 2014), pp. 582-594.

International Search Report and Written Opinion dated Jul. 18, 2019 in corresponding International PCT Application No. PCT/EP2018/075081, 11 pages.

Farmann et al: "Critical review of on-board capacity estimation techniques for lithium-ion batteries in electric and hybrid electric vehicles", Journal of Power Sources, vol. 281, May 2015, pp. 114-130.

European Patent Office Action dated Nov. 6, 2023, in corresponding European Patent Application No. 18 806 976.9-1205, 41 pages.

Zhou et al.: "On-line Estimation of Lithium Polymer Batteries State-of-Charge Using Particle Filter Based Data Fusion With Multi-Models Approach," Northwestern Polytechnical University, 8 pages, China.

Singh et al.: "Fault Diagnosis of Li-Ion Batteries Using Multiple-Model Adaptive Estimation," Purdue School of Engineering and Technology, 6 pages, India.

Chinese Office Action and Search Report dated Oct. 26, 2023, in corresponding Chinese Patent Application No. 201880097382.0, 20 pages.

* cited by examiner

METHOD FOR ESTIMATING AN OPERATING PARAMETER OF A BATTERY CELL IN A VEHICLE

CROSS-REFERENCE TO RELATED APPLICATIONS

This application is a U.S. National Stage application of PCT/EP2018/075081, filed Sep. 17, 2018, and published on Mar. 26, 2020, as WO 2020/057721 A1, all of which is hereby incorporated by reference in its entirety.

TECHNICAL FIELD

The invention relates to a method for estimating an operating parameter of a battery cell of a battery unit comprised in an electrical propulsion system of a vehicle.

The invention can be applied in any type of hybrid vehicles or electrical vehicles, such as partly or fully electrical vehicles. Although the invention will be described with respect to an electrical bus, the invention is not restricted to this particular vehicle, but may also be used in other hybrid or electrical vehicles such as electrical trucks, electrical construction equipment, and electrical cars. The invention may also be applied in any other type of electrical vehicle such as electrical powered construction equipment, electrical working machines e.g. wheel loaders, articulated haulers, dump trucks, excavators and backhoe loaders etc.

BACKGROUND

Batteries are becoming a more common source of power for providing propulsion for vehicles. Such batteries are often rechargeable batteries and typically include a number of battery cells that may be connected in series or in parallel forming a complete battery pack for the vehicle. Typically, a battery pack includes a number of battery cells. The quality of the battery pack is partly dependent on the quality of each battery cell, thereby setting strict requirements on the production quality of the battery cells. However, the battery cells may nevertheless have somewhat different capacities despite the high quality and may also age differently due to e.g. different operating temperature of each battery cell.

In order to determine the state-of-charge (SOC) and provide capacity estimation of a series-cell configured battery pack, data on average value of battery cell voltages and battery pack current may be used. These estimations typically assume that electrochemical characteristics of all battery cells are approximately identical. However, the SOC levels for the battery cells will eventually drift apart leading to an uneven state-of-charge distribution which limits the operational performance for the battery pack. In addition, when there are discrimination among battery cells because of aging and battery cell's different electrochemical characteristics, the variation of average battery cell voltages may not represent each cell's capacity in an accurate manner. Moreover, total capacity of the battery pack assembly is normally limited by the single battery cell having the lowest capacity.

Moreover, the SOC level and other operational conditions of the battery are typically estimated using a model of one or several battery cells of the battery pack. A common type of a battery model comprises an equivalent circuit model through which current-voltage characteristics may be obtained for the battery model. Algorithms are used together with the model and typically needs inputs relating to the battery, for example the capacity and impedance of the battery cells of the battery. However, such inputs typically change as the battery ages, which make the estimations more complicated. Furthermore, it is important that the inputs to the algorithms are accurate in order to avoid imprecise estimations of e.g. state of charge.

Further, in hybrid or electrical vehicles, it is often needed to have a sufficiently good knowledge of the battery properties for various operating conditions. Thus, there is an increasing demand for providing an on-board capacity estimation in such vehicles.

By way of example, the capacity of a battery cell can be estimated by a voltage-based estimation method using open circuit voltage and SOC correlation during an idle or operational time of the vehicle. Some examples of possible methods for capacity estimation for battery cells are described in Farmann, A., et al. "Critical review of on-board capacity estimation techniques for lithium-ion batteries in electric and hybrid electric vehicles." Journal of Power Sources 281 (2015): 114-130. However, at least some of the available methods for estimating the capacity of a battery cell require long computation time due to sophisticated algorithms.

Thus, it would be desirable to provide a method for efficient estimation of an operating parameter such as the capacity of a battery cell. In particular, it would be desirable to provide a method for estimating the operating parameter of the battery cell during operation of the vehicle.

SUMMARY

An object of the invention is to provide an improved method for estimating an operating parameter such as a capacity or impedance of a battery cell of a battery unit comprised in an electrical propulsion system of a vehicle. The object is at least partly achieved by a method according to claim 1.

According to a first aspect of the invention, there is provided a method for estimating an operating parameter of a battery cell of a battery unit in an electrical propulsion system of a vehicle. The operating parameter is indicative of one of capacity and impedance of the battery cell. The method comprises the steps of selecting at least one battery cell in the battery unit for determining the operating parameter of the battery cell; providing a set of state-of-charge (SOC) estimators, each SOC estimator having a selected operating parameter value for a given time period; and using the set of SOC estimators to determine a value of the operating parameter of the battery cell by performing voltage error minimization.

By the steps of the method according to the example embodiments, it becomes possible to provide an accurate and computational effective method for estimating an operating parameter such as the capacity of a battery cell of a battery unit in a vehicle, in particular by using a set of SOC estimators to determine a value of the operating parameter (e.g. the capacity value). In other words, the invention is based on the realization that a more accurate estimation of the operating parameter value of a battery cell is possible by utilizing a bank of SOC estimators for some periods of time with different capacity settings. Thus, the method according to the example embodiments provides a better SOC estimation based on more correct cell model parameter values.

It is to be noted that the example embodiments and the example advantages as mentioned herein are generally described when the operating parameter refers to the capacity of a battery cell. Accurate capacity estimation allows for an accurate driving range prediction and accurate calculation of a battery's maximum energy storage capability in a vehicle. At the same time, accurate capacity estimation can act as an indicator for battery state-of-health and remaining useful lifetime estimation. At least partly due to the correlation between lifetime and state-of-health between the capacity of the battery cell and the state-of-health, e.g. decreased capacity of the battery cell with age.

However, it is also likely that the method can be performed when the operating parameter refers to the impedance of the battery cell of a battery unit. Therefore, the example advantages as mentioned herein are applicable both when the operating parameter refers to the capacity of a battery cell and the impedance of a batter cell of a battery unit.

The example embodiments of the method are particularly useful for estimating the capacity of a battery cell of a battery unit during ordinary operation of the electrical propulsion system. By way of example, the method according to the example embodiments can be used as an integrated part of a battery unit management system. Thus, the capacity of one or more battery cell(s) of the battery unit can be estimated on-board (or on-line) of the vehicle and typically during operation of the vehicle.

In other words, the operating parameter may for example be a battery cell capacity parameter or an impedance (e.g. resistance or capacitance) of the battery cell. According to one example embodiment, the operating parameter may be the capacity of a battery cell. According to another example embodiment, the operating parameter may be the impedance of the battery cell.

In case of estimating the capacity of the battery cell, the term "capacity" refers to a measure, typically in ampere-hours (Ah) of the charge stored by the selected battery cell. The battery capacity represents the maximum amount of energy that can be extracted from the battery cell under certain given conditions. However, the actual energy storage capabilities of the battery cell can vary significantly from the "nominal" rated capacity, as the battery cell capacity depends on the age and past history of the battery, the charging or discharging regimes of the battery and the temperature.

By way of example, the capacity value is a normalized capacity value obtained by a base value such as the nominal battery cell capacity. The capacity value may as well be a dimensionless relative capacity value.

In case of estimating the impedance of the battery cell, the operating parameter may be a parameter of an equivalent circuit model of a battery cell of the battery. For example, such an operating parameter may be an internal resistance $R_0$, or the resistive part $R_1$ or the capacitance $C_1$ of an RC-circuit of the equivalent circuit model.

According to one example embodiment, the step of using the set of SOC estimators to determine the value of the operating parameter of the battery cell by performing voltage error minimization comprises the step of performing a curve fitting. A "curve fitting" is used in order to find the minimum of the voltage errors and then the value of the operating parameter of the battery cell, e.g. the value of the capacity of the battery cell. One advantage with curve fitting is that the method can be performed with a low number of SOC estimators in the bank. By way of example, the number of SOC estimators may be three. Curve fitting also provides for a relatively inexpensive method, partly as the computational complexity is reduced when performing capacity estimation. By way example, the curve fitting is a regression analysis.

According to one example embodiment, the step of performing a curve fitting corresponds to a polynomial fit. One advantage with using a polynomial fit is that the computational complexity of the method is further reduced. By way of example, the polynomial fit is one of a second order polynomial and a fourth order polynomial.

According to one example embodiment, the step of determining the value of the operating parameter of the battery cell comprises the step of identifying the value of the operating parameter that minimizes the polynomial.

By way of example, the value of the operating parameter of the battery corresponds to the SOC estimators minimizing some residual of the voltage error. The residual of the voltage error typically corresponds to battery cell terminal voltage-based residual, i.e. the error between the cell voltage estimated with a SOC estimator and the measured voltage.

Typically, the residual of the voltage error is one of a root mean squared error and an L1 norm of the voltage error.

According to one example embodiment, the SOC estimators in the set of SOC estimators are generated by using Kalman filtering.

According to one example embodiment, the method further comprises the step of reducing noise in the determined value of the operating parameter by using a filtering algorithm. By way of example, the filtering algorithm is as a recursive least squares with a forgetting factor to reduce the effects of the noise in the determined value of the operating parameter.

According to one example embodiment, the method further comprises the step of selecting an adjacent value of the operating parameter being adjacent the determined value of the operating parameter, and updating one of the operating parameter settings of one of the SOC estimators with the adjacent value of the operating parameter.

According to one example embodiment, the method further comprises the step of monitoring an operating condition such as temperature or SOC, and estimating the operating parameter of the battery cell when the operating condition is within a given operating condition range.

The method according to the example embodiments can be executed in several different manners. According to one example embodiment, the steps of the method are performed by a control unit during use of the electrical energy storage system by an electrical propulsion system. Typically, the control unit is configured to estimate the operating parameter of the battery cell.

Generally, the term "electrical propulsion system", as used herein, typically refers to vehicle electrical components for providing energy (such as traction energy) and for storing energy (delivering and receiving energy). Besides the electrical components as mentioned above, an electrical propulsion system may include additional components such as the electrical energy source, including a battery unit assembly, cable(s), sensor(s), control units, battery management unit(s) etc. The electrical propulsion system is in particular configured to deliver and receive energy for providing propulsion to the vehicle, but also for performing various vehicle operations of the vehicle.

One component of the electrical propulsion system is the electrical energy storage system. The electrical energy storage system has a multiple number of individual battery units connectable to form a battery unit assembly.

The battery unit may be a battery cell string comprising a number of interconnected single battery cells, whereby the battery unit assembly is a battery pack for the vehicle. In this example embodiment, the multiple numbers of individual battery units corresponds to a multiple numbers of individual battery strings connectable to form a battery unit assembly in the form of a battery pack.

Alternatively, the battery unit is a battery pack comprising a plurality of battery cell strings. In this case the battery unit assembly comprises a plurality of battery packs forming a battery pack assembly. Thus, in this example embodiment, the multiple numbers of individual battery units corresponds to a multiple numbers of individual battery packs connectable to form a battery pack assembly.

Typically, the battery units (battery packs) are connected in parallel in the battery unit assembly (battery pack assembly). In addition, the battery cells are typically connected in series in the battery cell string. In addition, the battery cell strings are typically connected in parallel in the battery pack.

It is to be noted that the battery unit assembly can refer to one or several number of battery pack(s). In addition, it is to be noted that the battery unit assembly can include different types of batteries. By way of example, any one of the batteries in the battery unit assembly is any one of a lithium-ion battery or sodium-ion battery. A sodium-ion battery typically includes any type of sodium iron battery or sodium ferrite battery. The battery unit assembly thus typically comprises a set of battery pack. Also, it is to be noted that the battery pack is generally a so called high voltage battery pack. In this context, the term "high voltage" refers to a battery pack of about 400-1000 voltage (V).

Further, the term "power", as used herein, typically refers to electrical power. Electrical power is the product of voltage and current.

In the context of the example embodiments of the invention, the term "state of charge (SOC)", as used herein, refers to the available capacity at the present status of the battery unit assembly. The SOC may also include or represent the charge level of a battery cell, a single battery unit, a single battery pack, the electrical energy storage system or a combination thereof. The SOC is typically determined in percentage (%) between available capacity and rated capacity of a new battery cell or current capacity of a battery cell.

In electrical vehicles comprising a battery pack assembly, the SOC has several different purposes, e.g. it may be used as an input to other battery management functions, including but not limited to SOP, SOQ, SOR, SOE, in overall vehicle energy management, in a charging strategy, as input to an life time estimator, as input to an ageing time estimator, as input when analysing fault cases and as input to range estimation or a combination thereof.

As mentioned above, the example embodiments of the method and the sequences/steps of the methods are executed by the control unit. Thus, according to one example embodiment, the steps of the method are performed by the control unit during ordinary use of the electrical propulsion system and/or the vehicle. The method may be continuously running as long as the vehicle is operative, but also continuously running when the vehicle is in a non-operative state while the battery unit is used, e.g. during a charging operation. Accordingly, the phrase "during use of the battery unit" may refer to the state of charging of the battery unit, and to the state of using (discharging) the battery unit during operation of the vehicle, e.g. driving of the vehicle.

The sequences of the method may likewise be performed by other types of components and by other technologies as long as the method can provide the associated functions and effects. Moreover, the method can likewise be implemented for controlling a model of the battery unit, the model comprising an equivalent circuit of the battery unit(s) making up the electrical energy storage system. A common type of a battery model comprises an equivalent circuit model through which current-voltage response may be obtained for the model battery.

As mentioned above, in one example embodiment there is provided a method for estimating the capacity of a battery cell of the battery unit in the electrical propulsion system of a vehicle. In this example, the method comprises the steps of selecting at least one battery cell in the battery unit for determining the capacity of the battery cell; providing a set of state-of-charge (SOC) estimators, each SOC estimator having a selected capacity value for a given time period; and using the set of SOC estimators to determine a capacity value of the battery cell by performing voltage error minimization.

According to a second aspect of the present invention, there is provided a computer program comprising program code means for performing the steps of any one of the example embodiments of the first aspect when the program is run on a computer. Effects and features of the second aspect of the invention are largely analogous to those described above in connection with the first aspect.

According to a third aspect of the present invention, there is provided a computer readable medium carrying a computer program comprising program code means for performing the steps of any of the embodiments of the first aspect when the program product is run on a computer. Effects and features of the third aspect of the invention are largely analogous to those described above in connection with the first aspect.

According to a fourth aspect of the present invention, there is provided an electrical propulsion system for a vehicle. The electrical propulsion system comprises an electrical motor for providing power to the vehicle; an electrical energy storage system connected to the electrical motor to provide power to the electrical motor, the electrical energy storage system having a number of battery units comprising a number of battery cells; a control unit for estimating an operating parameter of at least one battery cell, the operating parameter being indicative of one of capacity and impedance of the battery cell. The control unit is configured to select at least one battery cell in the at least one battery unit, provide a set of state-of-charge (SOC) estimators, each SOC estimator having a selected operating parameter value for a given time period. Moreover, the control unit is configured to use the set of SOC estimators to determine a value of the operating parameter of the battery cell by voltage error minimization.

Effects and features of the fourth aspect of the invention are largely analogous to those described above in connection with the first aspect. The electrical propulsion system can be incorporated and installed in a partly or fully electrical vehicle.

The electrical motor can be provided in several different manners. According to one example embodiment, the electrical motor is any one of a permanent magnet synchronous machine, a brushless DC machine, an asynchronous machine, an electrically magnetized synchronous machine, a synchronous reluctance machine or a switched reluctance machine. Typically, the electrical motor is configured for driving at least a ground engaging member. Typically, the electric motor is configured for driving a pair of ground engaging members. By way of example, the ground engaging member is a wheel, a track or the like. The electrical motor can be coupled to the ground engaging members in several different manners. In one example embodiment, the electrical motor is coupled to a pair of ground engaging members by means of a transmission and a clutch. The transmission typically comprises a number of gears including a neutral gear.

The control unit may include a microprocessor, microcontroller, programmable digital signal processor or another programmable device. Thus, the control unit comprises electronic circuits and connections as well as processing circuitry such that the control unit can communicate with different parts of the electrical propulsion system such as the electrical machines and the battery system in order to provide the functions of the example embodiments. Typically, the control unit may also be configured to communicated with other parts of the vehicle such as the brakes, suspension, the clutch, transmission and further electrical auxiliary devices, e.g. the air conditioning system, in order to at least partly operate the bus. The control unit may comprise modules in either hardware or software, or partially in hardware or software and communicate using known transmission buses such as CAN-bus and/or wireless communication capabilities. The processing circuitry may be a general purpose processor or a specific processor. The control unit typically comprises a non-transitory memory for storing computer program code and data upon. Thus, the control unit may be embodied by many different constructions.

In other words, the control functionality of the example embodiments of the method and/or the electrical propulsion system may be implemented using existing computer processors, or by a special purpose computer processor for an appropriate system, incorporated for this or another purpose, or by a hardwire system. Embodiments within the scope of the present disclosure include program products comprising machine-readable medium for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions. While the example embodiments of the electrical propulsion system described above includes a control unit being an integral part thereof, it is also possible that the control unit may be a separate part of the vehicle, and/or arranged remote from the electrical propulsion system and in communication with the electrical propulsion system.

The control unit may also include a model of one battery unit or a plurality of battery units, or a combination thereof. Thus, the electrical energy storage system typically includes the control unit configured to control the functionality of the battery unit assembly. In other words, the electrical energy storage system is typically a part of the vehicle propulsion system. The electrical energy storage system may also include a so called battery management unit which can be an integral part of the control unit or a separate part of the system but in communication with the control unit.

The control unit is generally configured to control and monitor the battery pack assembly. Typically, although strictly not required, the control unit includes the battery management unit configured to monitor battery cell characteristics such as state of charge (SOC) and open circuit voltage of the battery cells. Other functions of the battery management unit may relate to safety functions, such as state-of-power, and/or closing the contactors.

According to a fifth aspect of the present invention, there is provided a vehicle, such as a fully or hybrid electrical vehicle, comprising an electrical propulsion system according to any one of the example embodiment mentioned above. Effects and features of the fifth aspect of the invention are largely analogous to those described above in connection with the first aspect.

The vehicle may be an electrical, hybrid, or plug-in hybrid vehicle comprising an electrical motor, wherein the battery unit assembly provides power to the electrical motor for providing propulsion for the vehicle. It is to be noted that the vehicle can therefore be either a partly of fully electrical vehicle.

Further features of, and advantages with, the present invention will become apparent when studying the appended claims and the following description. The skilled person realize that different features of the present invention may be combined to create embodiments other than those described in the following, without departing from the scope of the present invention.

BRIEF DESCRIPTION OF THE DRAWINGS

The above, as well as additional objects, features and advantages of the present invention, will be better understood through the following illustrative and non-limiting detailed description of exemplary embodiments of the present invention, wherein:

FIG. 3 is a flow-chart of a method according to an example embodiment of the invention, in which the method comprises a number of steps for estimating an operating parameter of the battery cell in FIG. 2a;

Figure 1:
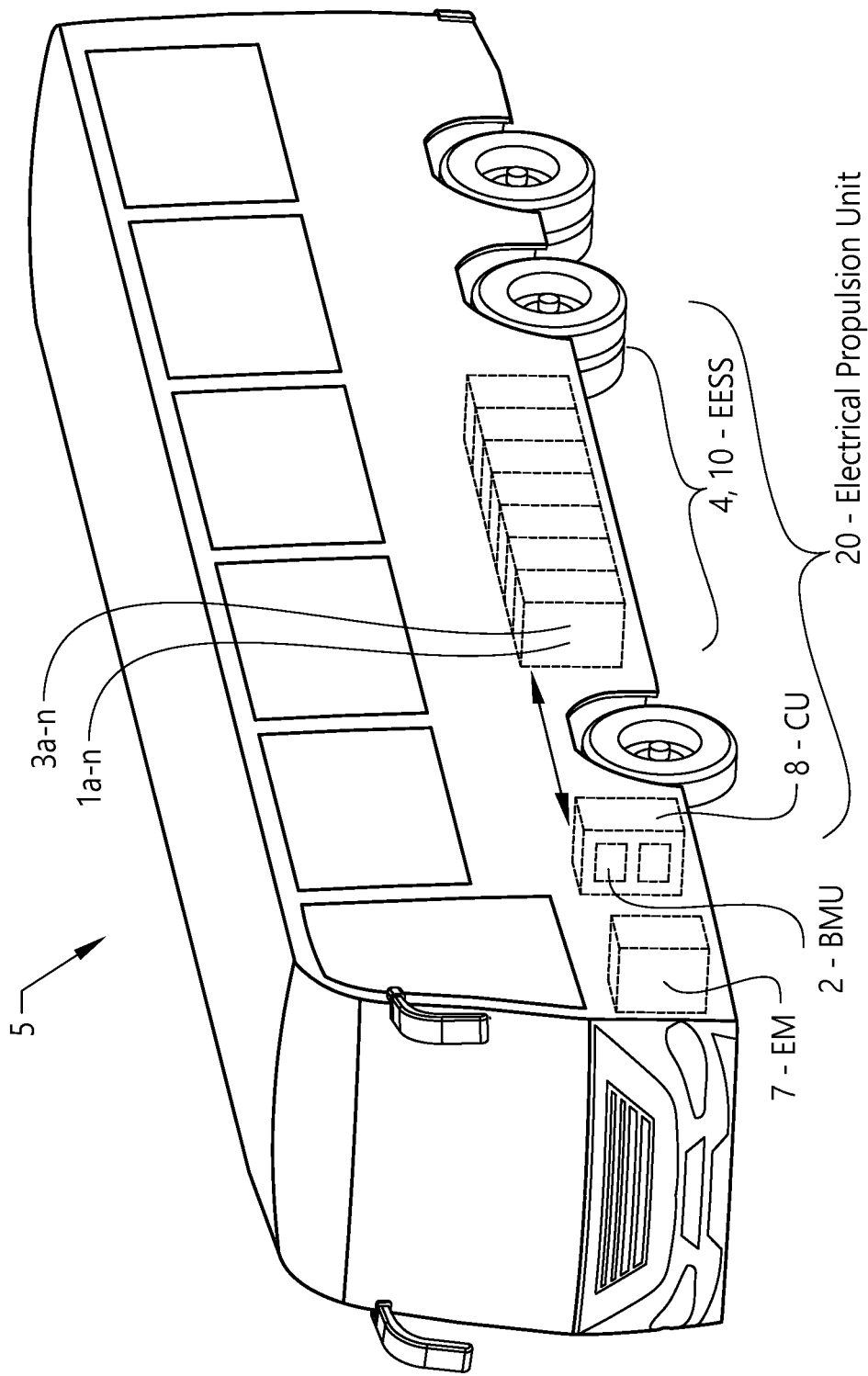
FIG. 1 is a side view of vehicle in the form an electrical bus according to example embodiments of the invention, the vehicle comprising an electric propulsion system.

With reference to the appended drawings, below follows a more detailed description of embodiments of the invention cited as examples.

DETAILED DESCRIPTION OF EXAMPLE EMBODIMENTS OF THE INVENTION

The present invention will now be described more fully hereinafter with reference to the accompanying drawings, in which exemplary embodiments of the invention are shown. The invention may, however, be embodied in many different forms and should not be construed as limited to the embodiments set forth herein; rather, these embodiments are provided for thoroughness and completeness. The skilled person will recognize that many changes and modifications may be made within the scope of the appended claims. Like reference character refer to like elements throughout the description.

FIG. 1 illustrates a vehicle in the form of an electrical bus 5. The electrical bus is here a fully electrical vehicle, which is typically entirely powered by an electrical energy storage system such as a battery system. The electrical bus 5 comprises an electrical propulsion system 20 configured to provide traction power to the vehicle. The electrical propulsion system 20 provides electrical power to an electrical motor. However, the electrical propulsion system can also be adapted to manage various electronic functions of the vehicle. The electrical propulsion system comprises the electrical energy storage system 10 and the electrical motor 7. The electrical energy storage system 10 is connected to the electrical motor to provide power to the electrical motor, thereby the electrical motor can provide traction power to one or more ground engaging members (not shown), e.g. one or more wheels. The electrical energy storage system is a DC electrical energy storage system such as the battery pack assembly comprising a number of battery packs.

The electrical energy storage system 10 here comprises a battery unit assembly 4. The battery unit assembly typically includes a plurality of battery units $1_a$ to $1_n$. In the electrical energy storage system depicted in FIG. 1, the battery unit is a battery pack. By way of example, each one of the battery packs is a lithium-ion battery. Moreover, each one of the battery packs comprises a number of battery cells. In this context, the battery pack is a battery comprising a plurality of battery cells 3. As such, each one of the battery packs $1_a$ to $1_n$ comprises a plurality of battery cells $3_a$ to $3_n$. As illustrated in FIG. 1, the battery pack assembly comprises seven battery packs. The battery pack assembly 4 thus includes seven number of battery packs $1_a$-$1_g$, each one of them comprising a number of battery cells $3_a$ to $3_g$. The battery pack assembly may comprise 50-500 battery cells. The number of battery packs in the battery pack assembly and the number of battery cells varies depending on type of vehicle and type of installation, etc.

To this end, the electrical energy storage system comprises the number of battery packs connected to form the battery pack assembly 4. In the following description of the example embodiments of the invention, the battery unit will therefore sometimes be referred to as a battery pack and the battery unit assembly as a battery pack assembly.

Accordingly, the battery pack assembly 4 is arranged to provide electrical power to the electrical motor 7 arranged for providing propulsion for the electrical bus 5. Typically, the electrical bus 5 further comprises a control unit 8 configured to control and monitor the electrical energy storage system 10. In particular, the control unit is configured to estimate the capacity of a battery cell. The control unit is here an electronic control unit. In particular, the control unit 8 is configured to control and monitor the battery pack assembly. The electrical propulsion system 20 here comprises the control unit 8 including the battery management unit 2 and the battery pack assembly 4. Typically, although strictly not required, the control unit 8 has a battery management unit 2 configured to monitor battery cell characteristics such as state of charge (SOC) and open circuit voltage of the battery cells 3. The control unit is further provided with a storage component (not shown) adapted to store a battery equivalent models as will be further discussed in relation to FIGS. 2a and 2b.

The control unit 8 may include a microprocessor, microcontroller, programmable digital signal processor or another programmable device. Thus, the control unit comprises electronic circuits and connections (not shown) as well as processing circuitry (not shown) such that the control unit can communicate with different parts of the vehicle such as the brakes, suspension, driveline, in particular the electrical motor, a clutch, and a gearbox in order to at least partly operate the bus 5. While the example embodiment described above includes a control unit being an integral part of the system 20, it is also possible that the control unit may be a separate part of the system 20 or the like.

Figure 2A:
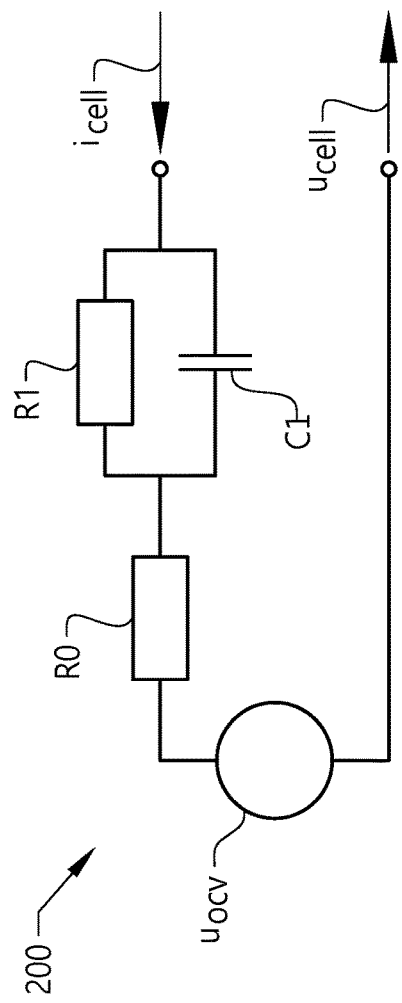
FIG. 2a schematically illustrates parts of a cell model describing a battery cell according to example embodiments of the invention.

Turning now to FIG. 2a, there is depicted a battery cell model comprising an equivalent circuit of a battery cell. The exemplary equivalent circuit model 200 comprises a single RC circuit to model the battery cell. The exemplary RC based equivalent circuit model is used for estimation of the state of charge and capacity of the battery cell, and is typically implemented by the above mentioned control unit. The exemplified (equivalent) circuit model illustrated in FIG. 2a is used for estimating the state of charge and capacity of the battery cell. The characterization of the battery cell may be calculated by real-time parameter estimation approaches on battery models using direct battery measurements. The battery cell charge state estimation may for example be based on measured battery current inputs and a battery terminal voltage.

The equivalent circuit model described in relation to FIG. 2a consists of an active electrolyte resistance (or internal resistance) R0, in series with the parallel capacitance C1, and an active charge transfer resistance R1. $u_{cell}$ refers to terminal voltage output, $i_{cell}$ refers to the current in the circuit and $u_{OCV}$ refers to the battery open circuit voltage. For given values of the terms $u_{OCV}$, R0, R1 and C1, the terminal voltage $u_{cell}$ can be expressed as a function of the current $i_{cell}$. Normally R0 and R1 increases by age, while battery cell capacity (not illustrated in the figure) decreases by age.

By the equivalent circuit model of the battery cell 3a, it becomes possible to determine a state charge level of a battery cell. As such, it is possible to monitor the state charge level of a battery cell of the battery system. In this context, it is to be noted that SOC estimation is normally based on voltage and current. One ingredient in a SOC estimator is thus to use the relation between SOC-OCV (OCV is voltage when there is no current). Therefore, the SOC of a battery cell is estimated and determined based on the battery system open circuit voltage (OCV), which in FIG. 2a is indicated with $u_{OCV}$. Determining battery cell SOC by OCV is commonly known in the art, and is typically performed by measuring the OCV of the battery cell. The OCV of a battery cell is determined by measuring the terminal voltage output $u_{cell}$ of the battery cell when the cell is disconnected from any external load and no external electric current flows through the cell. The OCV is in direct correlation with the SOC of the battery cell.

Figure 2B:
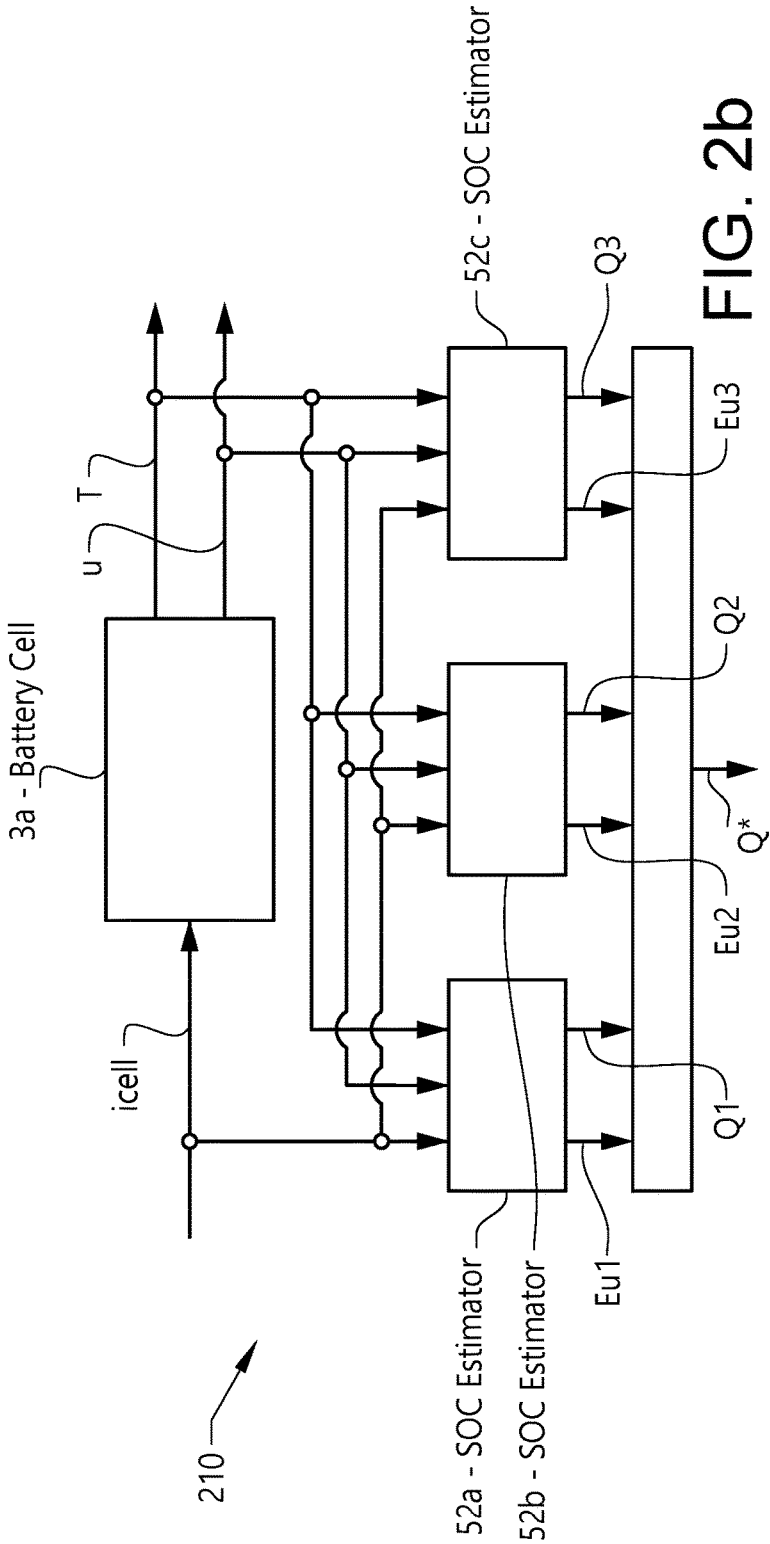
FIG. 2b schematically illustrates an overview of some computational components used when performing some of the steps in a method according to an example embodiment of the invention.

Turning now to FIG. 2b, there is depicted an overview of some computational components used for performing parts of the calculation process of the method according to an example embodiment, and which is based on data received from the battery cell model comprising an equivalent circuit of a battery cell, as described in conjunction with FIG. 2a. In other words, FIG. 2b illustrates some steps of a method for estimating an operating parameter of the battery cell 3a by means of a number of state-of-charge (SOC) estimators 52A, 52B, 52C. In this example, the operating parameter is the capacity Q of the battery cell. It is to be noted that the measured battery parameters $i_{cell}$ and $u_{cell}$ are described in relation to FIG. 2a, while T refers to battery cell temperature. Also, it is to be noted that $U_{OCV}$ (voltage without current) is a function of SoC. In this context, terminal voltage is a function of OCV and ohmic voltage drop. Ohmic voltage drop depends on current and temperature. Thereby, the parameters $i_{cell}$, T and, $u_{cell}$ can be used as input in the number of SOC estimators for estimating the capacity Q of a battery cell. This type of model is also commonly known as the thevenin cell model. It should also be readily appreciated that the SOC estimator that provides the most precise estimation typically provides the most accurate capacity estimation.

In addition, the SOC estimator parameters (or the battery properties) Q1, Q2, Q3 refers to capacitive values of the corresponding SOC estimators SOC1, SOC2, SOC3, respectively. That is, the Q1, Q2 and Q3 are the capacities used in each SoC estimator SOC1, SOC2, SOC3, respectively. The signals Eu1, Eu2, and Eu3 are the residuals (i.e. voltage error) of each SoC estimator SOC1, SOC2, SOC3, respectively.

The output in FIG. 2b is indicated as Q*, which corresponds to the estimated or determined capacity of a battery cell of the battery unit, and which is further described hereinafter in relation to e.g. FIGS. 3 to 6. As will be readily appreciated from the description below, Q* is in one example embodiment determined by Equations 13 to 15.

Figure 3:
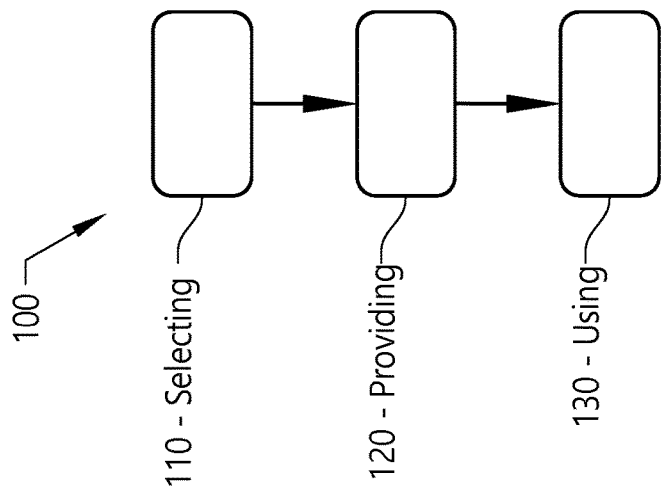

Turning now to FIG. 3, there is depicted a flowchart of a method according to example embodiments of the invention. In particular, there is depicted a method 100 for estimating an operating parameter indicative of the capacity Q* of the battery cell 3a of the battery unit $1_a$ comprised in the electrical propulsion system 20 of the vehicle 5. The estimated capacity Q* obtained by the method can be used as input data in a vehicle energy management strategy, e.g. as input in controlling the vehicle electrical energy storage system 10 of the vehicle electrical propulsion system 20 as described above in relation to FIG. 1. The sequences of the method are typically performed by the control unit 8, as described above in relation to the FIG. 1.

The method comprises selecting 110 at least one battery cell (e.g. battery cell $3_a$) in the battery unit (e.g. battery unit $1_a$) for determining the capacity Q* of the battery cell. The selection of the battery cell among the number of battery cells is performed by the control unit 8. Typically, the selection of the battery cell may be determined in beforehand and follow a predetermined schedule, e.g. determined at programming of the software of the control unit. The selection of the battery cell may also be dynamically selected based on input from the control unit as well as selected during operation of the vehicle and the electrical propulsion system, thus during ordinary use of the battery unit and the battery cells making up the battery unit.

Next, the method comprises providing 120 a set of state-of-charge (SOC) estimators. Each SOC estimator has a selected capacity value for a given time period. The capacity values are selected in order to include the actual value of the capacity. In this manner, a rough presumption can be made based on the nominal value of the capacity.

It should be noted that the range of the parameters for the type of battery cells to be analysed is typically known, and that the selected capacity values of the SOC estimators are chosen capacity values in the neighborhood of an assumed capacity value of the battery cell, i.e. a capacity value that the battery cell should have. Alternatively, it is possible to use an iterative process, e.g. starting with quite spread capacity values, and then finding the capacity values (operating parameters values) closer to the estimates that are being made over time.

Typically, the selected capacity value of the SOC estimator is a discrete capacity value.

The length of the given time period should be a sufficient long time period. It depends on the cycle (current profile), the type of battery cell, and various conditions like cell temperature and SoC levels. By way of example, the length of the given time period was in the order of several minutes to few hours. The given time period may e.g. be about between 0.1 h to 8 h, preferably about between 0.5 h to 6 h, still preferably about between 1.0 h to 4 h. The given time period may be set to a different time period for other batteries and conditions.

The SOC estimators in the set of SOC estimators are in this example generated by using Kalman filtering.

Figure 6:
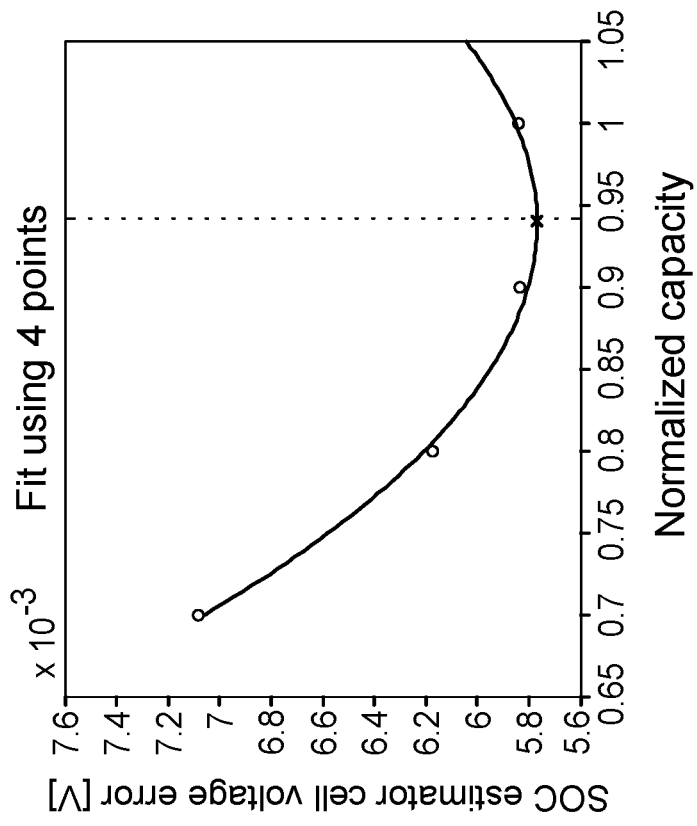
FIG. 6 schematically illustrates another example of a curve fitting for determining the capacity of a battery cell by voltage error minimization by a method according to an example embodiment of the invention.
Figure 5:
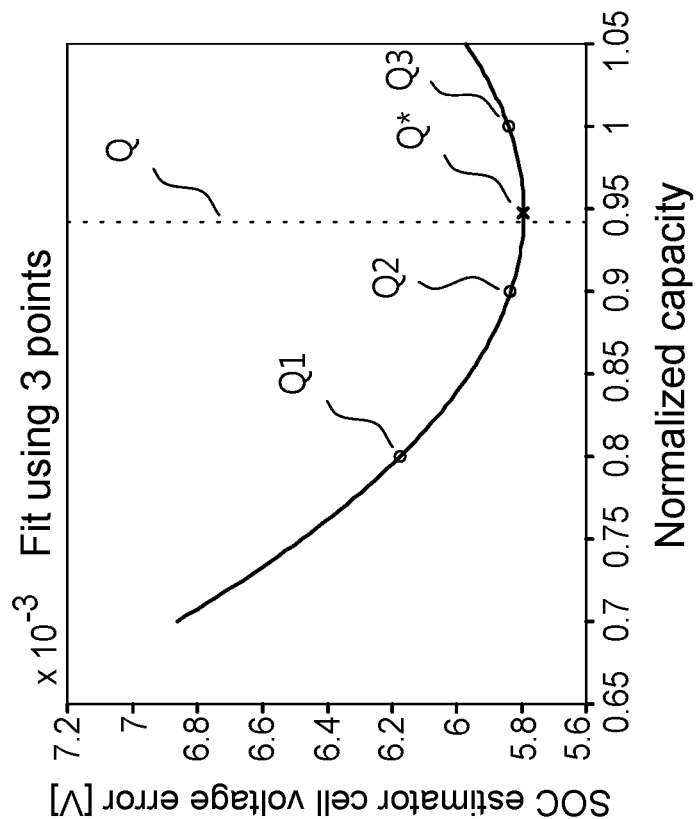
FIG. 5 schematically illustrates an example of a curve fitting for determining the capacity of a battery cell by voltage error minimization by a method according to an example embodiment of the invention.

In the following step, the method uses 130 the set of SOC estimators to determine a value of the capacity of the battery cell. The value of the capacity of the battery cell is identified by performing voltage error minimization. By way of example, the step of using the set of SOC estimators to identify the value of the capacity of the battery cell by voltage error minimization comprises the step of performing a curve fitting. One example of curve fitting is regression analysis. Typically, as also illustrated in FIGS. 5 and 6, the curve fitting corresponds to a polynomial fit. One example of suitable polynomial fit is a second order polynomial. Another example of suitable polynomial fit is a fourth order polynomial. A fourth order polynomial is described further below in relation to FIGS. 5 and 6.

In FIGS. 5 and 6, the plotted capacity value is a normalized capacity value obtained by a base value such as the nominal battery cell capacity.

Moreover, the step of identifying the value of the capacity here comprises the step of identifying the value of the capacity that minimizes the polynomial. In particular, the value of the capacity of the battery cell corresponds to the SOC estimators minimizing some residual of the voltage error. The residual of the voltage errors corresponds to battery cell terminal voltage-based residual, i.e. the error between the cell voltage estimated with a SOC estimator and the measured voltage. By way of example, the residual of the voltage error is a root mean squared error. Alternatively, the residual of the voltage error is an L1 norm of the voltage error.

In the following, it will be described how the polynomial fit solves a linear least square problem and how the minimum of the obtained polynomial is calculated. In other words, the below equations describe how the value of the capacity of the battery cell is identified by performing voltage error minimization.

Assuming that a fourth order polynomial of the following form is chosen:

$$p_2 \cdot Q_i^4 + p_1 \cdot Q_i^2 + p_0 \quad \text{(Eq. 2)}$$

wherein $p_2$, $p_1$, $p_0$ are coefficients (parameters) of the polynomial that multiply the variables of the polynomial, which in the above example is only the battery cell capacity $Q_i$ is the capacity chosen in the SoC estimator number i. If the size of the bank of SoC estimators is four, then i={1, 2, 3, 4}.

The least square problem to be solved for the previous example is $$\begin{cases} p_2 \cdot Q_1^4 + p_1 \cdot Q_1^2 + p_0 = E_{u1} \\ p_2 \cdot Q_2^4 + p_1 \cdot Q_2^2 + p_0 = E_{u2} \\ p_2 \cdot Q_3^4 + p_1 \cdot Q_3^2 + p_0 = E_{u3} \\ p_2 \cdot Q_4^4 + p_1 \cdot Q_4^2 + p_0 = E_{u4} \end{cases} \quad \text{(Eq. 3)}$$

wherein $E_{ui}$ is the voltage error of the SoC estimator number i.

The previous system of linear equations could be written in a matrix form as:

$$X \cdot \beta = Y \quad \text{(Eq. 4)}$$

wherein $$X = \begin{bmatrix} Q_1^4 & Q_1^2 & 1 \\ Q_2^4 & Q_2^2 & 1 \\ Q_3^4 & Q_3^2 & 1 \\ Q_4^4 & Q_4^2 & 1 \end{bmatrix}$$

$$\beta = \begin{bmatrix} p_2 \\ p_1 \\ p_0 \end{bmatrix}$$

$$Y = \begin{bmatrix} E_{u1} \\ E_{u2} \\ E_{u3} \\ E_{u4} \end{bmatrix}$$

The solution of the previous least squares problem is given by:

$$\beta^* = (X^T \cdot X)^{-1} \cdot X^T \cdot Y \quad \text{(Eq. 5)}$$

By way of example, the sets of values of $Q_i$ are set in advance, then the previous expression can be reduced to $$\beta^* = Z \cdot Y \quad \text{(Eq. 6)}$$

and $Z = (X^T \cdot X)^{-1} \cdot X^T$ is a matrix of 3* n that is pre-calculated and stored in a memory of the control unit (as mentioned above), and n is the number of SoC estimators in the bank.

For example, for three SOC estimators, i.e. n=3, then 9 parameters need to be stored in the memory. Note that in fact not all of them are needed as it will be presented below, since some entries are not needed in the step 6 of the algorithm.

Since the number of parameters in Z is rather small, the parameters of several matrices for different combinations of values of capacity can be pre-calculated and stored in memory.

Referring now to an example for three SOC estimators, which is illustrated in FIG. 5:

$$Q_1 = 1.00, Q_2 = 1.05, Q_3 = 1.10 \quad \text{(Eq. 7)}$$

Then $$Z = \begin{bmatrix} z_{11} & z_{12} & z_{13} \\ z_{21} & z_{22} & z_{23} \\ z_{31} & z_{32} & z_{33} \end{bmatrix} = \begin{bmatrix} -46.5 & -90.8 & 44.3 \\ -107.4 & 200.6 & -93.1 \\ 62.0 & -109.8 & 48.9 \end{bmatrix} \quad \text{[Eq. 8]}$$

Next, the method in step 130 finds the capacity value that minimizes the polynomial.

The problem to solve is:

$$\min_C (p_2 \cdot Q^4 + p_1 \cdot Q^2 + p_0) \quad \text{(Eq. 9)}$$

After a change of variable:

$$d = Q^2 \quad \text{(Eq. 10)}$$

then the minimization problem to solve is:

$$\min(p_2 \cdot d^2 + p_1 \cdot d + P_0) \quad \text{(Eq. 11)}$$

The solution is $$d^* = -\frac{p_1}{2 \cdot p_2} \quad \text{(Eq. 12)}$$

which means that the estimated capacity is:

$$Q^* = \sqrt{-\frac{p_1}{2 p_2}} \quad \text{(Eq. 13)}$$

Combining the results of the above equations Eq. 1 to Eq. 13, the capacity that minimizes the polynomial is:

For Three SoC Estimators:

$$Q^* = \sqrt{-\frac{(z_{21} \cdot E_{u1} + z_{22} \cdot E_{u2} + z_{23} \cdot E_{u3})}{(z_{11} \cdot E_{u1} + z_{12} \cdot E_{u2} + z_{13} \cdot E_{u3})}} \quad \text{(Eq. 14)}$$

Accordingly, only 6 parameters need to be stored in an electronic control unit, e.g. in the control unit memory $\{z_{11}, z_{12}, z_{13}, z_{21}, z_{22}, z_{23}\}$.

Accordingly, as depicted in FIG. 5, there is depicted one example of a curve fitting for determining the capacity of the battery cell by voltage error minimization. In this example, the capacity values correspond to normalized capacity values obtained by a base value such as the nominal battery cell capacity. Moreover, the estimated capacity value is here determined by using a second order polynomial. The x-axis refers to normalized capacity and the y-axis refers to SOC estimator cell voltage error in Voltage.

In this example, the method is based on using a bank of three SoC estimators. The bank of three SoC estimators provides three selected discrete capacity values, i.e. 0.8, 0.9, and 1.0 of nominal capacity. The mark depicted as a star in the diagram indicates the estimated capacity value Q* (the value estimated by Eq. 14 above), while the dashed line indicates the actual capacity value Q of the battery cell. In this example, the actual capacity value is received from the data from the equivalent circuit model of the battery cell. In this example the actual capacity value is 0.942 of nominal capacity. It is to be noted that the actual capacity value Q of the battery cell is known due to that simulation data is used, and the actual capacity value Q is here indicated for illustration purposes (in real-time estimation onboard a vehicle, the actual capacity value is unknown).

Moreover, in this example, residuals of voltage error are calculated using the root mean squared of the voltage errors.

As can be derived from the above in combination with the diagram in FIG. 5, the estimated battery cell capacity Q* with 3 points is 0.947, and the estimation error is 0.53%. In this context, the estimation error refers to the error between the estimated capacity value (0.947) and the actual value (0.942).

For Four SoC Estimators:

In another example, when combining the results of the above equations Eq. 1 to Eq. 13, the capacity that minimizes the polynomial is for four SoC estimators:

$$Q^* = \sqrt{-\frac{(z_{21} \cdot E_{u1} + z_{22} \cdot E_{u2} + z_{23} \cdot E_{u3} + z_{24} \cdot E_{u4})}{(z_{11} \cdot E_{u1} + z_{12} \cdot E_{u2} + z_{13} \cdot E_{u3} + z_{14} \cdot E_{u4})}} \quad \text{(Eq. 15)}$$

In this example, only 8 parameters need to be stored in the control unit memory $\{z_{11}, z_{12}, z_{13}, z_{14}, z_{21}, z_{22}, z_{23}, z_{24}\}$.

Accordingly, as depicted in FIG. 6, there is depicted another example of a curve fitting for determining the capacity of the battery cell by voltage error minimization. In this example, the capacity values also correspond to normalized capacity values obtained by a base value such as the nominal battery cell capacity. Moreover, the estimated capacity value is here determined by using a second order polynomial.

In this example, the method is based on using a bank of four SoC estimators. The bank of four SoC estimators provides three selected discrete capacity values, i.e. 0.7, 0.8, 0.9, and 1.0 of nominal capacity. The mark depicted as a star in the diagram indicates the estimated capacity value Q* (value estimated in Eq. 15 above), while the dashed line indicates the actual capacity value Q of the battery cell. In this example, the actual capacity value is received from the data from the equivalent circuit model of the battery cell. In this example the actual capacity value is 0.942 of nominal capacity.

Moreover, in this example, residuals of voltage error are calculated using the root mean squared of the voltage errors.

As can be derived from the above, in combination with the diagram in FIG. 6, the estimated battery cell capacity Q* with 4 points is 0.940, and the estimation error is 0.22%. The estimated error refers to the error between the estimated capacity value (0.940) and the actual capacity value (0.942).

In another example, although not shown, the capacity can be estimated by a bank of four SoC estimators and with a fourth order polynomial fitting of the L1 norm of the battery cell voltage errors.

It should be readily appreciated that the method according to various example embodiments may be performed on a single battery cell, a number of battery cells, on all battery cells of a battery pack as well as on all battery cells of the all battery packs making up the battery pack assembly. In addition, the method can estimate the capacity of various battery cells simultaneously, in parallel or in sequence.

It may also be noted that the control unit 8 can be configured to estimate the operational power for each one of the battery packs.

Figure 4:
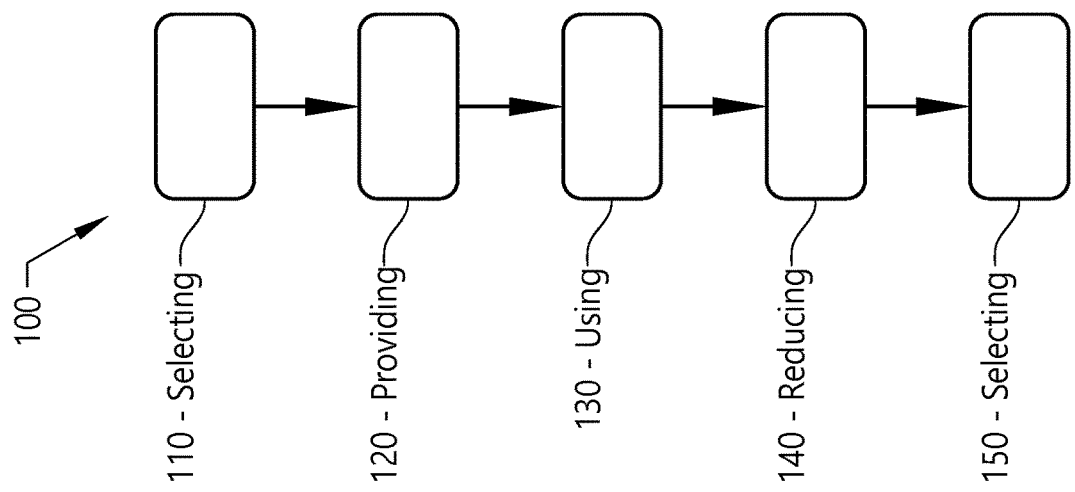
FIG. 4 is a flow-chart of additional steps of the method in FIG. 3 according to an example embodiment of the invention.

In FIG. 4, there is depicted some additional steps of the method as described in relation to FIG. 3. In this example, the method further comprises the step 140 of reducing noise in the determined value of the capacity by using a filtering algorithm. By way of example, the filter algorithm is a recursive least squares with a forgetting factor to reduce the effects of the noise in the determined capacity value. A filtering algorithm is introduced to avoid sharp spikes in signals. As capacity changes slowly with time, it is desirable to avoid sudden changes in the estimated values due to e.g. inaccuracies in the measurements.

Optional, the method also comprises the step 150 of selecting an adjacent value of the capacity being adjacent the determined value of the capacity in step 130, and updating one of the selected capacity values of one of the SOC estimators with the adjacent value of the capacity parameter of the battery cell. Thereafter, the step 130 is iterated to determine a new value of the capacity according to step 130, and any subsequent step as described herein.

Optional, the method may also comprise the step of monitoring an operating condition such as temperature or SOC of a battery cell. Subsequently, the method can estimate the capacity of the battery cell when the operating condition is within a given operating condition range.

As mentioned above, it is to be noted that the steps of the method is typically performed by the control unit 8 during use of the electrical energy storage system 10 by the electrical propulsion system 20.

Although the figures may show a sequence, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps. Additionally, even though the invention has been described with reference to specific exemplifying embodiments thereof, many different alterations, modifications and the like will become apparent for those skilled in the art.

It is to be understood that the present invention is not limited to the embodiments described above and illustrated in the drawings; rather, the skilled person will recognize that many changes and modifications may be made within the scope of the appended claims. For example, although the present invention has mainly been described in relation to an electrical bus, the invention should be understood to be equally applicable for any type of electric vehicle, in particular an electric truck or the like.

The invention claimed is:

1. A method for estimating an operating parameter of a battery cell of a battery unit in an electrical propulsion system of a vehicle, the operating parameter being indicative of one of capacity and impedance of the battery cell, wherein the method comprising the steps:
   selecting at least one battery cell in the battery unit for determining the operating parameter of the battery cell;
   providing a set of state-of-charge (SOC) estimators, each SOC estimator having a selected operating parameter value for a given time period; and
   using the set of SOC estimators to determine a value of the operating parameter of the battery cell by performing voltage error minimization.

2. Method according to claim 1, wherein the step of using the set of SOC estimators to determine the value of the operating parameter of the battery cell by voltage error minimization comprises the step of performing a curve fitting.

3. Method according to claim 2, wherein the step of performing a curve fitting corresponds to a polynomial fit.

4. Method according to claim 3, wherein the step of determining the value of the operating parameter of the battery cell comprises the step of identifying the value of the operating parameter that minimizes the polynomial.

5. Method according to claim 1, wherein the value of the operating parameter of the battery corresponds to the SOC estimators minimizing some residual of the voltage error.

6. Method according to claim 5, wherein the residual of the voltage error is a root mean squared error or an L1 norm of the voltage error.

7. Method according to claim 1, wherein the SOC estimators in the set of SOC estimators are generated by using Kalman filtering.

8. Method according to claim 1, further comprising the step of reducing noise in the determined value of the operating parameter by using a filtering algorithm.

9. Method according to claim 1, further comprising the step of selecting an adjacent value of the operating parameter being adjacent the determined value of the operating parameter, and updating one of the operating parameter settings of one of the SOC estimators with the adjacent value of the operating parameter.

10. A non-transitory computer readable medium carrying a computer program comprising program code for performing the steps of claim 1 when said program code is run on a computer.

11. A non-transitory computer readable medium carrying a computer program comprising program means for performing the steps of claim 1 when said program means is run on a computer.

12. An electrical propulsion system for a vehicle, the electrical propulsion system comprising:
    an electrical motor for providing power to the vehicle;
    an electrical energy storage system connected to the electrical motor to provide power to the electrical motor, the electrical energy storage system having a number of battery units comprising a number of battery cells a control unit for estimating an operating parameter of at least one battery cell, the operating parameter being indicative of one of capacity and impedance of the battery cell, the control unit being configured to select at least one battery cell in the at least one battery unit, provide a set of state-of-charge (SOC) estimators, each SOC estimator having a selected operating parameter value for a given time period; and
    wherein the control unit is further configured to use the set of SOC estimators to determine a value of the operating parameter of the battery cell by voltage error minimization.

13. A vehicle comprising an electrical propulsion system according to claim 12.

* * * * *